US006586965B2

United States Patent
Kuekes

(10) Patent No.: US 6,586,965 B2
(45) Date of Patent: Jul. 1, 2003

(54) MOLECULAR CROSSBAR LATCH

(75) Inventor: Phillip J. Kuekes, Menlo Park, CA (US)

(73) Assignee: Hewlett Packard Development Company LP, Houston, TX (US)

(*) Notice: Subject to any disclaimer, the term of this patent is extended or adjusted under 35 U.S.C. 154(b) by 0 days.

(21) Appl. No.: 10/016,593

(22) Filed: Oct. 29, 2001

(65) Prior Publication Data

US 2003/0080775 A1 May 1, 2003

(51) Int. Cl.[7] .............................................. H03K 19/73
(52) U.S. Cl. ......................................... 326/37; 326/101
(58) Field of Search ............................. 326/39, 101, 37

(56) References Cited

U.S. PATENT DOCUMENTS

| 6,128,214 A | 10/2000 | Kuekes et al. ............... 365/151 |
| 6,256,767 B1 | 7/2001 | Kuekes et al. .................. 716/9 |
| 2002/0114557 A1 * | 8/2002 | Zhang et al. .................. 385/17 |

OTHER PUBLICATIONS

USSN 09/282,048, "Chemically Synthesized and Assembled Electronic Devices", filed on Mar. 29, 1999.
USSN 09/280,225, "Molecular Wire Crossbar Interconnect", filed on Mar. 29, 1999.
USSN 09/282,045, "Molecular Wire Crossbar Logic (MWCL)", filed on Mar. 29, 1999.

* cited by examiner

Primary Examiner—Don Le

(57) ABSTRACT

A molecular crossbar latch is provided, comprising two control wires and a signal wire that crosses the two control wires at a non-zero angle to thereby form a junction with each control wire. Each junction forms a switch and the junction has a functional dimension in nanometers. The signal wire selectively has at least two different voltage states, ranging from a 0 state to a 1 state, wherein there is an asymmetry with respect to the direction of current flow from the signal wire through one junction compared to another junction such that current flowing through one junction into (out of) the signal wire can open (close) while current flowing through the other junction out of (into) the signal wire can close (open) the switch, and wherein there is a voltage threshold for switching between an open switch and a closed switch. Further, methods are provided for latching logic values onto nanowires in a logic array, for inverting a logic value, and for restoring a voltage value of a signal in a nano-scale wire.

30 Claims, 4 Drawing Sheets

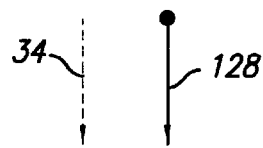 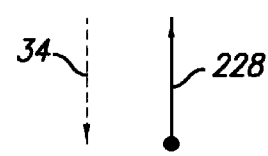
FIG. 5a   FIG. 5b
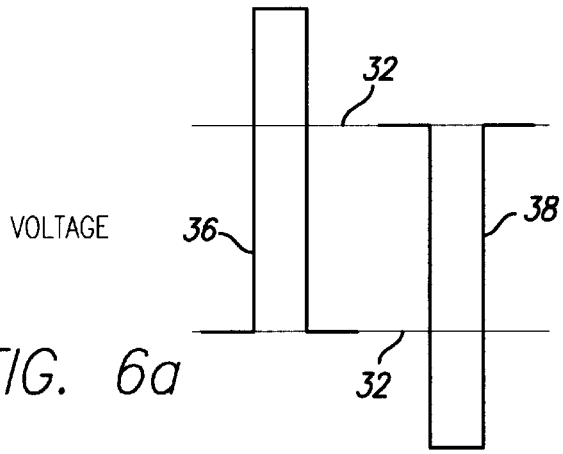
FIG. 6
PRIOR ART
FIG. 6a
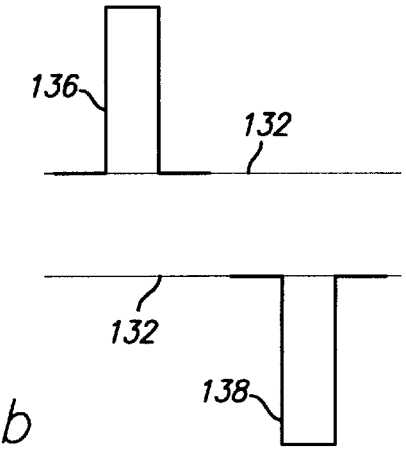
FIG. 6b

MOLECULAR CROSSBAR LATCH

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. DABT-63-99-3-0003 awarded by Defense Advanced Research Projects Agency.

TECHNICAL FIELD

The present invention is related generally to electronic devices whose functional length scales are measured in nanometers, and, more particularly, to a latch for use with crossbar arrays based on crossed nanometer-scale wires joined by voltage-settable switches at the intersecting junctions.

BACKGROUND ART

Nano-computing is based on the premise of switches that are of nanometer scale in the functional dimension(s). Examples of technology used in implementing nano-scale switches are disclosed and claimed in the following: application Ser. No. 09/282,048, entitled "Chemically Synthesized and Assembled Electronic Devices", filed on Mar. 29, 1999, in the names of James R. Heath et al; application Ser. No. 09/280,225, entitled "Molecular Wire Crossbar Interconnect", filed on Mar. 29, 1999, in the names of Philip J. Kuekes et al; application Ser. No. 09/282,045, entitled "Molecular Wire Crossbar Logic (MWCL)", filed on Mar. 29, 1999, in the names of Philip J. Kuekes et al; U.S. Pat. No. 6,128,214, entitled "Molecular Wire Crossbar Memory", issued to Philip J. Kuekes et al on Oct. 3, 2000; and U.S. Pat. No. 6,256,767, entitled "Demultiplexer for a Molecular Wire Crossbar Network", issued to Philip J. Kuekes et al on Jul. 3, 2001, all assigned to the same assignee as the present application.

To have fully general computing, one must have not only logic functions and memory functions, but we must be able to take a logical variable and put it into a memory and be able to reuse it as the input to another logic function. This allows one to build finite state machines and thus do completely general computing. One method of doing this is to use a latch.

While such a latch is well-known in the art of general computing, as that art has developed in the year 2001, advances in the art of nano-computing require new approaches to developing a latching functionality at the nanometer scale.

Thus, what is needed is a latch that is specifically configured for nano-meter-scale computing and is compatible in size with nanometer scale logic.

DISCLOSURE OF INVENTION

In accordance with the present invention, a molecular crossbar latch is provided, comprising two control wires and a signal wire that crosses the two control wires at a non-zero angle to thereby form a junction with each control wire. Each junction forms a switch and the junction has a functional dimension in nanometers. The signal wire selectively has at least two different voltage states, ranging from a 0 state to a 1 state, wherein there is an asymmetry with respect to the direction of current flow from the signal wire through one junction compared to another junction such that current flowing through one junction into (out of) the signal wire can open (close) the first switch while current flowing through the other junction out of (into) the signal wire can close (open) the other switch, and wherein there is a voltage threshold for switching between an open switch and a closed switch.

A method is provided for latching logic values onto nanowires in a logic method comprises:

(a) providing the molecular crossbar latch; and (b) applying a sequence of voltages to the two control wires that results in setting the switches of the two junctions such that either the first switch is open and the second switch is closed if the signal wire had a voltage representing a logic 1, or the first switch is closed and the second switch is open if the signal wire had a voltage age representing a logic 0, thereby latching the signal.

Secondly, a method is provided for restoring a voltage value of a signal in a nano-scale switch. The method comprises:

(a) providing the molecular crossbar latch;

(b) latching the signal as above; and (c) placing a voltage representing logic 0 on the first control wire and a voltage representing logic 1 on the second control wire.

Finally, a method is provided for inverting a voltage value of a signal in a nano-scale switch. The method comprises:

(a) providing the molecular crossbar latch;

(b) latching the signal as above; and (c) placing a voltage representing logic 1 on the first control wire and a voltage representing logic 0 on the second control wire.

No latch has previously been demonstrated at the nanometer scale. The present invention allows a nanometer scale latch to be both constructed and integrated with other circuits using the crossbar. Further, the present invention provides at a nanometer scale: latching of an arbitrary logic signal, restoration of logic signal strength, possible inversion of the latched output, and multiple latches with very few clocking connections to outside circuits. The combination of the proceeding features allows the construction of arbitrarily complex logic designs.

BRIEF DESCRIPTION OF THE DRAWINGS

FIGS. 5a–5b are each a schematic representation of an asymmetric switch in the open (FIG. 5a) and closed (FIG. 5b) positions;

FIG. 6, on a vertical scale in volts, depicts the voltage levels involved in going from a voltage representation to a switch representation for the operation of a latch;

FIG. 6a, on a vertical scale in volts, depicts an unconditional open pulse and an unconditional close pulse;

FIG. 6b, on a vertical scale in volts, depicts a conditional open pulse and a conditional close pulse employed in the practice of the present invention;

BEST MODES FOR CARRYING OUT THE INVENTION

Definitions

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

Present Invention

The present invention allows one to build latches from crossbar switches. Crossbar switches are disclosed in the above-listed patent applications and issued patents.

Figure 1:
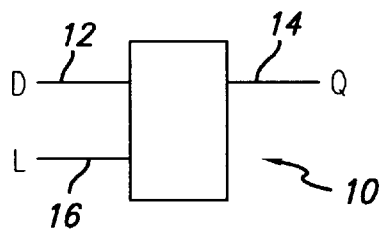
FIG. 1 is a schematic drawing, depicting the logical function of a latch.

FIG. 1 shows the logical function of a latch 10. There is an input D 12, an output Q 14, and a latch control L 16, such that the state of L determines whether Q is the same logical value as D (L=0) or if L=1, then Q retains the value of D at the time L changed from 0 to 1. Thus, $Q_t=D_t$ if L=0 and $Q_{t+1}=Q_t$ if L=1. The signal has been latched in the latter case.

Figure 2A:
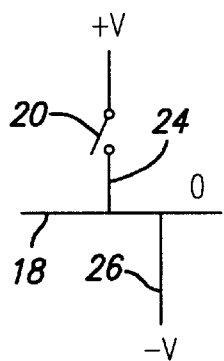
FIGS. 2a–2b are schematic drawings, depicting how to go from a switch representation to a voltage representation.
Figure 2B:
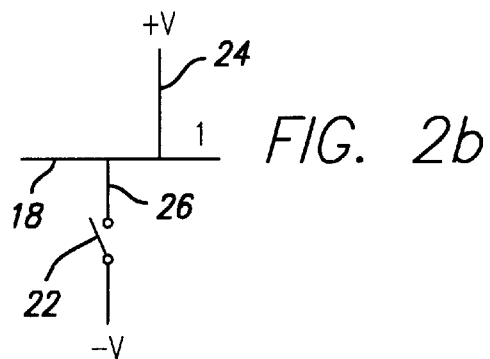

The essential functionality that one must have in order to build a latch is to be able to go back and forth between a voltage representation of a logic value (logic) and a switch representation of a logic value (memory). FIGS. 2a–2b show how to go from a switch representation to a voltage representation. Clearly, the given signal line 18 can be set to either a 0 or a 1 by using two control switches 20, 22, one of which connects to a line 24 which pulls up and the other which connects to a line 26 which pulls down. If the switch 22 that pulls down is closed, and the other switch 20 is open, then there will be a 0 on the signal line 18. If the switch 20 that pulls up is closed, and the other switch 22 is open, then there will be a 1 on the signal line 18.

The logic value of the switches 20, 22 has been transferred to the voltage representation of a logic value on the signal wire 18.

Figure 3:
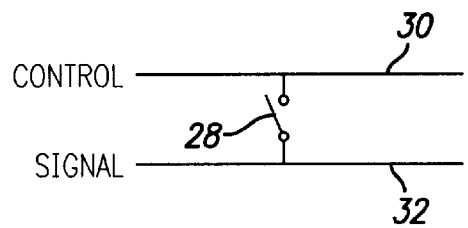
FIG. 3 is a schematic drawing, depicting how to go from a voltage representation to a switch representation.

FIG. 3 shows the essential method that can be used to go from voltage representation to switch representation. This a crossbar switch, comprising a switch 28 at the junction of two crossed wires 30, 32, and one can either open or close a switch based on the voltage difference of the control line 30 and the signal line 32. (The wires 30, 32 appear to be in the same plane, but, in reality, one crosses the other at some non-zero angle, typically, 90 degrees.) It is easy to use a voltage on the signal line 32 to open or close one switch 28. This is the function of setting a bit of memory in a crossbar array, as disclosed in U.S. Pat. No. 6,128,214, supra. The latch function requires that a single voltage on a signal wire 32 opens one switch 28 and closes another.

Figure 4:
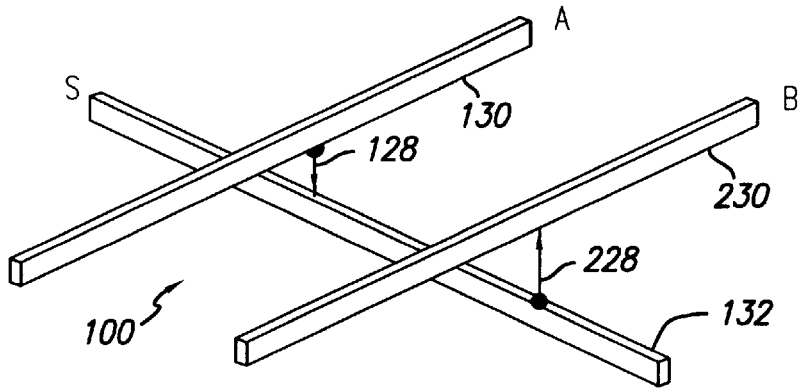
FIG. 4 is a schematic drawing, in perspective, of a latch configuration in accordance with the present invention, comprising two control lines and a signal line that form two switches.

FIG. 4 shows the physical configuration of the latch 100, in accordance with the present invention. Two control wires 130 and 230 cross a signal wire 132. The resulting nanoscale molecular junctions 128, 228 are constructed to have asymmetric and opposite connections to the signal wire 132. The asymmetry of the junctions 128, 228 is shown by the symbol for a molecular switch which has an arrow at one end and a circle at the other.

Each junction 128, 228 may include a bi-stable molecule that is switchable from one state to another. The class of bi-stable molecules that may be repeatedly switched from one state to another and back may be employed in the practice of the present invention. Such molecules result in devices that are equivalent to RAM (random access memory) devices.

Examples of bi-stable molecules that perform switching on an electro-chemical reaction (reduction-oxidation, or "redox") include the rotaxanes, pseudo-rotaxanes, catenanes, and spiropyrans. Such bi-stable molecules may be employed in the practice of the present invention.

The functionality of the asymmetric switches 128, 228 is shown in FIGS. 5a–5b. The function of opening (closing) a switch depends both on the voltage across the switch being above a threshold and on the direction of current, shown by arrow 34. If the voltage is below a threshold, then the switch will not change its state. If the voltage is above a threshold, then the switch will open if the current is in one direction or closed if the current is in the opposite direction. The convention relating the direction of current (from high voltage to low voltage) to the physical direction of the asymmetric switch is shown in FIGS. 5a–5b. In FIG. 5a, the direction of the current 34 is in the same direction as the asymmetric switch 128. If the voltage is above threshold, then this will cause the switch 128 to open. Conversely, in FIG. 5b, the direction of the current 34 is in the opposite direction as the asymmetric switch 228. If the voltage is above threshold, then this will cause the switch 228 to close.

FIG. 6 illustrates the voltage levels in the system needed to understand the operation of the latch 100. The energy levels shown are based on the difference in voltage between the signal line 32 and the control line 30. The most positive voltage will open the switch 28. Below that are a strong 1, which is the initial value of a logic 1, and a weak 1 which is the lowest value to which a logic 1 is permitted to degrade. Correspondingly, there is a weak 0, a strong 0, and a most negative voltage which will close the switch 28. The relative order of these voltages allows the latch 100 to function.

FIG. 6a shows an unconditional open pulse 36 and an unconditional close pulse 38. These are effective independent of the voltage on the signal line 32, as long as the signal line has a legal logic value between strong 1 and strong 0. The pulse 36 shows that if the control line 30 goes sufficiently positive in absolute voltage relative to ground, then the voltage difference across the junction reaches the voltage to "open" independent of the signal line voltage. The pulse 38 shows that the switch 28 will be unconditionally closed if the control line 30 goes sufficiently negative relative to ground, again, independent of the signal line voltage as long as the signal line has a legal (between logic 0 and logic 1) voltage. This is exactly the method used to set or reset bits for use in memory or to define a programmable logic function.

The interesting variation, which is at the heart of the present invention, is that one can create conditional open or close pulses as shown in FIG. 6b. The pulse 136 in FIG. 6b is a conditional open pulse. If the value on the signal line 32 is a weak 1 or a strong 1, then the switch 28 will open. If the value is a weak 0 or strong 0, then the switch 28 will not open because there will be insufficient voltage across the switch to open it. The pulse 138 is a conditional close pulse. Only if the value on the signal line is a 0 will the switch 28 close.

The latch 100 works because the switch forms an asymmetric tunnel junction. The asymmetric molecular switch junction may be switched with either conditional (latching) pulses or unconditional pulses. The direction of current flow 34 through the device in one direction is considered to be "net oxidizing", whereas in the opposite direction, it is considered to be "net reducing"; see FIGS. 5a–5b. The molecular junction is characterized by a sharp, analytical oxidizing switching voltage to close, called herein "VM". All switches are unconditionally opened prior to the start of calculation. The logic output wire has a variable signal VS1 or VS0, representing either a 1 or a zero, respectively. Referring to FIG. 4, on the signal wire 132 and on the control wires 130, 230 can be put a voltage ±Vcond.

The opening and closing of the switch 28 is asymmetric with respect to the voltage bias (positive or negative) across the junction that will open or close the switch. This defines a polarity for the switch 28. If one connects two separate control lines 130, 230 to a single signal line 132 forming two junctions 128, 228, such that the polarities of the two junctions are reversed from each other with respect to the signal line, then the two junctions may be used as a latch. This latching is done by a sequence of pulses, an unconditional open pulse followed by conditional close pulses.

Figure 7:
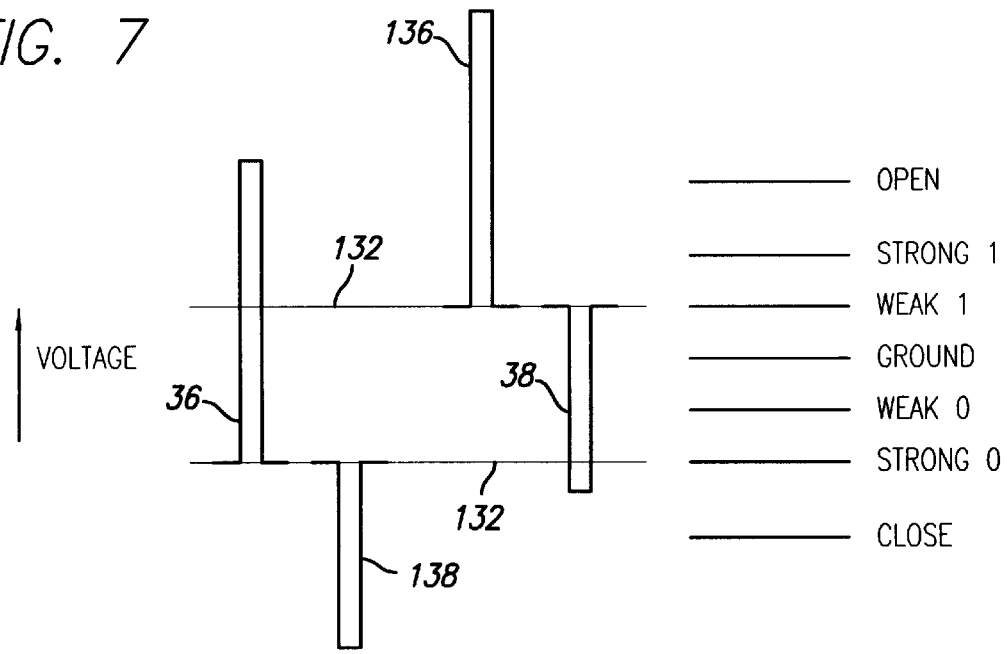
FIG. 7, on a vertical scale in volts, depicts the pulse sequence to latch a bit.

FIG. 7 shows how this works whether the signal line 132 is a 1 or a 0. On the left hand side, where there is a logic 0 on the signal line 132, an unconditional open pulse 36 will open the switch 28 and the subsequent conditional close pulse 138 will only close the switch if the signal is a 0. But as shown on the right two pulses 136, 38, a logic 1 voltage on the signal line 132 will result in the switch 28 being open. The pulses 136, 38 are designed such that a weak 0 can close the switch 28 but a weak 1 cannot close the switch.

FIGS. 6a, 6b, and 7 illustrate named voltage levels (close, strong 0, weak 0, weak 1, strong 1, and open) and a ground level. While the order is essential as to the named voltage levels, it will be appreciated by those skilled in this art that the ground level is relative, and its placement in these drawings is for illustration purposes only, and is not intended to thereby limit the invention.

Figure 8A:
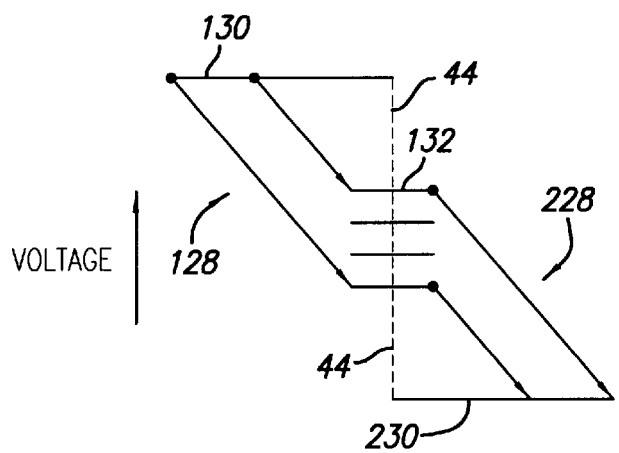
FIGS. 8a–8b, each on a vertical scale in volts, show the voltage levels on the latch of FIG. 4 to unconditionally open both switches (FIG. 8a) or to conditionally close one or the other switch simultaneously (FIG. 8b)
Figure 8B:
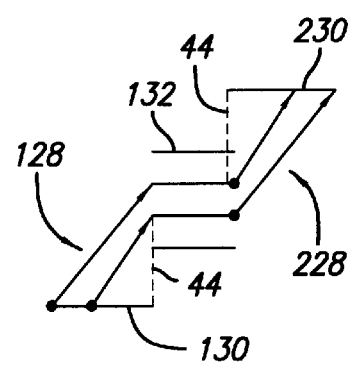
Figure 9A:
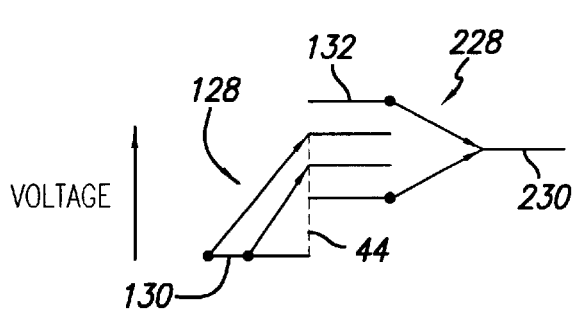
FIGS. 9a–9b, each on a vertical scale in volts, show the voltage levels on the latch of FIG. 4 to conditionally close one switch and then the other switch sequentially as an alternative to the embodiment depicted in FIG. 8b.
Figure 9B:
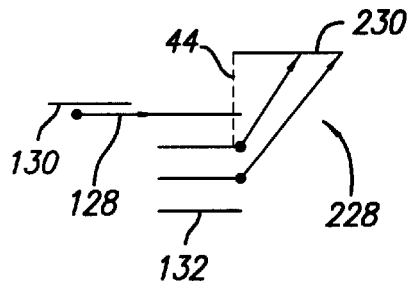
Figure 10:
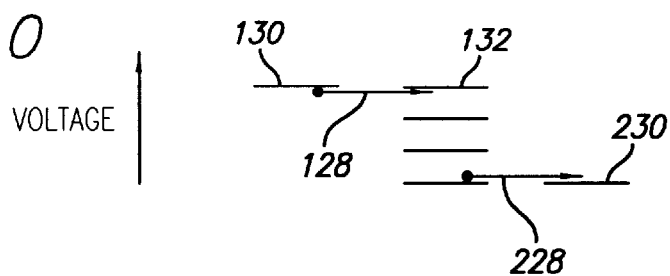
FIG. 10, on a vertical scale in volts, shows the voltage levels on the latch of FIG. 4 to restore logic values due to degradation of a signal level.

FIGS. 8–10 show the voltage levels on wires 130, 230, and 132. The voltage is in the vertical direction, with higher voltage at the top, as indicated. The direction of the asymmetric switches, between wire 132 and wires 130 and 230, is shown by the arrow and circle symbol discussed with reference to FIGS. 5a–5b. The vertical dashed lines 44 show the threshold voltage needed to open or close the switch. The four voltage levels shown for wire 132 are (from top to bottom) strong 1, weak 1, weak 0 and strong 0. FIG. 8a depicts the unconditional open condition, while FIG. 8b depicts the conditional close condition. In FIG. 8b, switch 128 is closed if wire 132 is at a 1, whereas switch 228 is closed if wire 132 is at a 0. In FIG. 9a, switch 128 is closed if wire 132 is at a 1, whereas in FIG. 9b, switch 228 is closed if wire 132 is at a 0. In FIG. 10 the logic values and latch signal are restored.

The sequence of voltages is shown in FIGS. 8–10. A sequence of three or four separate pairs of voltages results in the value that was initially on the signal line being restored to its full logic value, and kept on the signal line indefinitely. By "voltage pair" is meant the voltages on the two control lines 130, 230.

The voltage sequence has three steps:
(1) Unconditionally open both 128 and 228 switches (FIG. 8a).
(2) Conditionally close switch 128 if S=1; conditionally close switch 228 if S=0 (FIG. 8b).
(3) Connect wire 130 to logic 1 voltage level (FIG. 9a); connect wire 230 to logic 0 voltage level (FIG. 9b).

Step 2 may be done simultaneously for both switches as shown in FIG. 8b. Alternatively, Step 2 may be done in two consecutive sub steps as shown in FIGS. 9a and 9b, where switch 128 is closed and then switch 228 is closed. This has the advantage that the closing of switch 128 cannot disturb the logic value on wire 132 and thus accidentally close both switches 128 and 228. Specifically, when switch 128 is conditionally closed, then the state of switch 228 is left unchanged by applying a voltage on control wire 230 that is insufficient to change the state of switch 228 (FIG. 9a). Further, when switch 228 is conditionally closed, then the state of switch 128 is left unchanged by applying a voltage on control wire 130 that is insufficient to change the state of switch 128 (FIG. 9b). Thus, switch 228 will not change its state during the first sub step, and switch 128 will not change its state during the second sub step regardless of whether switch 228 closes or not.

The present invention also provides a logic inversion function. In the last step (3), if one reverses which wire is pulled up and which wire is pulled down by choosing to reverse the voltages, then one can invert a signal by latching it. By setting wire 130 to a strong logic 0 voltage and wire 132 to a strong logic 1 voltage in step 3, the signal will be inverted.

FIG. 10 shows that a latch can also be used to restore a logic voltage level. If the signal level representing logic 1 becomes degraded due to noise, resistive losses, or diode drops, then the voltage may be restored to the fully correct signal level after it has been latched.

Figure 11:
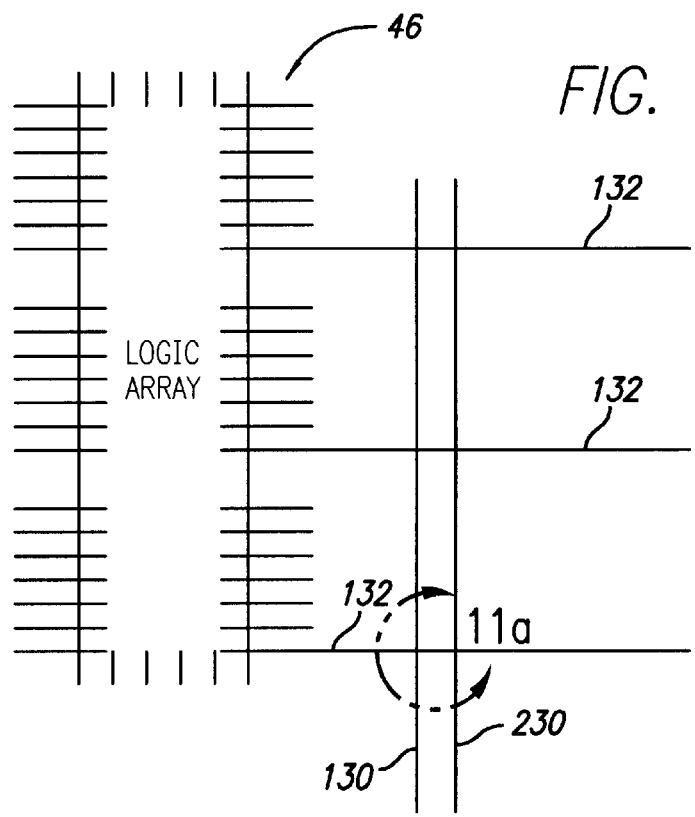
FIG. 11 depicts the use of a single pair of latch lines to control many latches and thereby latch separate logic values onto a large number of nanowires at the same time.
Figure 11A:
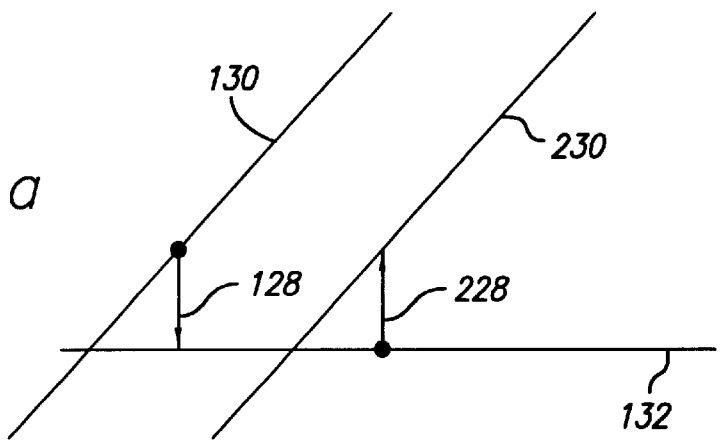
FIG. 11a is an enlargement of a portion of FIG. 11

As shown in FIGS. 11 and 11a, the present invention has the particular advantage that the two latch control lines 130, 230, which must be driven by conventional circuitry outside the nanoscale circuit, can be reused for a large number of logic signal lines 132. A single pair of latch lines 130, 230 control many latches. Two control lines 130, 230 can be used to latch separate logic values onto a large number of nanowires in a logic array 46 at the same time. This is very efficient in terms of the number of connections to the outside world.

Industrial Applicability

The molecular crossbar latch disclosed herein is expected to find use in nanoscale computing architectures. With a latch, one can construct finite state machines. A finite state machine is sufficiently powerful to in principle compute any function. Without a latch at the nanoscale, one would only have combinatorial logic, which can not do totally general computation.

What is claimed is:

1. A molecular crossbar latch comprising two control wires and a signal wire that crosses the two control wires at a non-zero angle to thereby form a junction with each control wire, wherein each junction forms a switch and each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch.

2. The molecular crossbar latch of claim 1 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

3. The molecular crossbar latch of claim 2 wherein said switch is conditionally opened by a voltage state on said signal wire denoted "weak 1" and is conditionally closed by a voltage state on said signal wire denoted "weak 1", where said weak voltage states are less strong than said strong voltage states.

4. The molecular crossbar latch of claim 1 wherein each said junction includes a bi-stable molecule to permit switching from one state to another state.

5. The molecular crossbar latch of claim 4 wherein said bi-stable molecule permits switching between an oxidized state and a reduced state, employing an electrochemical reaction.

6. The molecular crossbar latch of claim 5 wherein said bi-stable molecule is selected from the group consisting of rotaxanes, pseudo-rotaxanes, catenanes, and spiropyrans.

7. A method for latching logic values onto nanowires in a logic array, said method comprising:

(a) providing a molecular crossbar latch comprising two control wires and a signal wire that crosses the two control wires at a non-zero angle to thereby form a junction with each control wire, wherein each junction forms a switch and each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch; and (b) applying a sequence of voltages to said two control wires that results in setting said switches of said two junctions such that either said first switch is open and said second switch is closed if said signal wire has a voltage representing a logic 0, or said first switch is closed and said second switch is open if said signal wire has a voltage representing a logic 1.

8. The method of claim 7 wherein said switch is unconditionally opened by a voltage state on said signal wire denoted "strong 1" and is unconditionally closed by a voltage state on said signal wire denoted "strong 0", where said "strong 1" and said "strong 0" are both above threshold levels.

9. The method of claim 8 wherein said switch is conditionally opened by a voltage state on said signal wire denoted "weak 1" and is conditionally closed by a voltage state on said signal wire denoted "weak 1", where said weak voltage states are less strong than said strong voltage states.

10. The method of claim 7 wherein each said junction includes a bi-stable molecule to permit switching from one state to another state.

11. The method of claim 10 wherein said bi-stable molecule permits switching between an oxidized state and a reduced state, employing an electrochemical reaction.

12. The method of claim 11 wherein said bi-stable molecule is selected from the group consisting of rotaxanes, pseudo-rotaxanes, catenanes, and spiropyrans.

13. The method of claim 7 wherein said sequence of voltages has three steps:

(a) unconditionally open both said switches;
  (b) conditionally close said first switch if said signal wire has a logic 1 and simultaneously conditionally close said second switch if said signal wire has a logic 0; and
  (c) connect said control wire associated with said first switch to a logic 1 voltage level and simultaneously connect said second control wire associated with said second switch to a logic 0 voltage level.

14. The method of claim 7 wherein said sequence of voltages has four steps:

(a) unconditionally open both said switches;
  (b) conditionally close said first switch if said signal wire has a logic 1 and leave the state of said second switch unchanged by applying a voltage on said control wire associated with said second switch that is insufficient to change its state;
  (c) then conditionally close said second switch if said signal wire has a logic 0 and leave the state of said first switch unchanged by applying a voltage on said control wire associated with said first switch that is insufficient to change its state; and
  (d) connect said control wire associated with said first switch to a logic 1 voltage level and simultaneously connect said second control wire associated with said second switch to a logic 0 voltage level.

15. A method for restoring a weakened voltage value of a signal to its full value in a nano-scale switch, said method comprising:

(a) providing a molecular crossbar latch comprising two control wires and a signal wire that crosses the two control wires at a non-zero angle to thereby form a junction with each control wire, wherein each junction forms a switch and each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch;

(b) latching said signal by applying a sequence of voltages to said two control wires that results in setting said switches of said two junctions such that either said first switch is open and said second switch is closed if said signal wire has a voltage representing a logic 0, or said first switch is closed and said second switch is open if said signal wire has a voltage representing a logic 1; and (c) placing a voltage representing logic 1 on said first control wire and a voltage representing logic 0 on said second control wire.

16. The method of claim 15 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

17. The method of claim 16 wherein said switch is conditionally opened by a voltage state on said signal wire denoted "weak 1" and is conditionally closed by a voltage state on said signal wire denoted "weak 1", where said weak voltage states are less strong than said strong voltage states.

18. The method of claim 15 wherein each said junction includes a bi-stable molecule to permit switching from one state to another state.

19. The method of claim 18 wherein said bi-stable molecule permits switching between an oxidized state and a reduced state, employing an electrochemical reaction.

20. The method of claim 19 wherein said bi-stable molecule is selected from the group consisting of rotaxanes, pseudo-rotaxanes, catenanes, and spiropyrans.

21. The method of claim 15 wherein said sequence of voltages has three steps:

(a) unconditionally open both said switches;

(b) conditionally close said first switch if said signal wire has a logic 1 and simultaneously conditionally close said second switch if said signal wire has a logic 0; and (c) connect said control wire associated with said first switch to a logic 1 voltage level and simultaneously connect said second control wire associated with said second switch to a logic 0 voltage level.

22. The method of claim 15 wherein said sequence of voltages has four steps:

(a) unconditionally open both said switches;

(b) conditionally close said first switch if said signal wire has a logic 1 and leave the state of said second switch unchanged by applying a voltage on said control wire associated with said second switch that is insufficient to change its state;

(c) then conditionally close said second switch if said signal wire has a logic 0 and leave the state of said first switch unchanged by applying a voltage on said control wire associated with said first switch that is insufficient to change its state; and (d) connect said control wire associated with said first switch to a logic 1 voltage level and simultaneously connect said second control wire associated with said second switch to a logic 0 voltage level.

23. A method for inverting the logic value of a signal in a nano-scale switch, said method comprising:

(a) providing a molecular crossbar latch comprising two control wires and a signal wire that crosses the two control wires at a non-zero angle to thereby form a junction with each control wire, wherein each junction forms a switch and each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch;

(b) latching said signal by applying a sequence of voltages to said two control wires that results in setting said switches of said two junctions such that either said first switch is open and said second switch is closed if said signal wire has a voltage representing a logic 0, or said first switch is closed and said second switch is open if said signal wire has a voltage representing a logic 1; and (c) placing a voltage representing logic 0 on said first control wire and a voltage representing logic 1 on said second control wire.

24. The method of claim 23 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

25. The method of claim 24 wherein said switch is conditionally opened by a voltage state on said signal wire denoted "weak 1" and is conditionally closed by a voltage state on said signal wire denoted "weak 1", where said weak voltage states are less strong than said strong voltage states.

26. The method of claim 23 wherein each said junction includes a bi-stable molecule to permit switching from one state to another state.

27. The method of claim 26 wherein said bi-stable molecule permits switching between an oxidized state and a reduced state, employing an electrochemical reaction.

28. The method of claim 27 wherein said bi-stable molecule is selected from the group consisting of rotaxanes, pseudo-rotaxanes, catenanes, and spiropyrans.

29. The method of claim 23 wherein said sequence of voltages has three steps:

(a) unconditionally open both said switches;
(b) conditionally close said first switch if said signal wire has a logic 1 and simultaneously conditionally close said second switch if said signal wire has a logic 0, and
(c) connect said control wire associated with said first switch to a logic 0 voltage level and simultaneously connect said second control wire associated with said second switch to a logic 1 voltage level.

30. The method of claim 23 wherein said sequence of voltages has four steps:
(a) unconditionally open both said switches;
(b) conditionally close said first switch if said signal wire has a logic 1 and leave the state of said second switch unchanged by applying a voltage on said control wire associated with said second switch that is insufficient to change its state;
(c) then conditionally close said second switch if said signal wire has a logic 0 and leave the state of said first switch unchanged by applying a voltage on said control wire associated with said first switch that is insufficient to change its state; and
(d) connect said control wire associated with said first switch to a logic 0 voltage level and simultaneously connect said second control wire associated with said second switch to a logic 1 voltage level.

* * * * *